(12) United States Patent
Jang et al.

(10) Patent No.: US 10,191,516 B2
(45) Date of Patent: Jan. 29, 2019

(54) FOLDABLE DISPLAY DEVICE (71) Applicant: LG Display Co., Ltd., Seoul (KR)

(72) Inventors: Se-Jin Jang, Paju-si (KR); Young-Joo Park, Busan (KR); Yu-Lim Won, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/827,001

(22) Filed: Nov. 30, 2017

(65) Prior Publication Data
US 2018/0150106 A1    May 31, 2018

(30) Foreign Application Priority Data

Nov. 30, 2016 (KR) .......................... 10-2016-0162341

(51) Int. Cl.
G06F 1/16      (2006.01)
G09F 9/30      (2006.01)
H05K 5/00      (2006.01)
H05K 5/02      (2006.01)
H01L 51/00     (2006.01)
H01L 51/52     (2006.01)
G02F 1/1333    (2006.01)

(52) U.S. Cl.
CPC .......... *G06F 1/1641* (2013.01); *G06F 1/1616* (2013.01); *G06F 1/1652* (2013.01); *G06F 1/1656* (2013.01); *G06F 1/1677* (2013.01); *G06F 1/1681* (2013.01); *G09F 9/301* (2013.01); *H01L 51/0097* (2013.01); *H01L 51/5253* (2013.01); *H05K 5/0017* (2013.01); *H05K 5/0226* (2013.01); *H05K 5/0247* (2013.01); *G02F 2001/133331* (2013.01); *H01L 2251/301* (2013.01); *H01L 2251/5338* (2013.01); *Y02E 10/549* (2013.01)

(58) Field of Classification Search
CPC ................. G06F 1/1652; G06F 1/1656; G02F 2001/133331
See application file for complete search history.

(56) References Cited

U.S. PATENT DOCUMENTS 7,379,128 B2 *  5/2008  Tsubokura .......... G02F 1/13394
                                                            349/58
8,374,654 B2 *  2/2013  Lu .......................... H04M 1/185
                                                            379/428.01

(Continued)

FOREIGN PATENT DOCUMENTS

TW    201405287 A    2/2014
TW    201605323 A    2/2016

OTHER PUBLICATIONS

Office Action dated Jun. 19, 2018 for a counterpart Taiwanese patent application No. 106141938.

*Primary Examiner* — Adrian S Wilson
(74) *Attorney, Agent, or Firm* — Polsinelli PC (57) ABSTRACT Disclosed is a foldable display device which may reduce an amount of impact energy reaching a display panel, when external impact energy is transmitted, and thus protect the display panel. The foldable display device includes a display panel including at least one folding part and non-folding parts, a cover window attached to the upper surface of the display panel, and a frame configured to receive the display panel and the cover window and to pull one side and the other side of the cover window in opposite directions.

23 Claims, 10 Drawing Sheets (56) References Cited

U.S. PATENT DOCUMENTS

| | | | |
|---|---|---|---|
| 8,804,324 B2 * | 8/2014 | Bohn | G06F 1/1616 |
| | | | 345/1.1 |
| 9,470,404 B2 * | 10/2016 | Lee | F21V 21/30 |
| 2002/0104769 A1 * | 8/2002 | Kim | G06F 1/1601 |
| | | | 206/320 |
| 2008/0246692 A1 * | 10/2008 | Jeong | G06F 1/1618 |
| | | | 345/1.3 |
| 2012/0002360 A1 * | 1/2012 | Seo | G06F 1/1616 |
| | | | 361/679.01 |
| 2012/0200789 A1 * | 8/2012 | Molne | G06F 3/0414 |
| | | | 349/12 |
| 2016/0302316 A1 | 10/2016 | Jeong et al. | |

* cited by examiner

FIG. 10 ical impact.

FOLDABLE DISPLAY DEVICE

CROSS-REFERENCE TO RELATED APPLICATION

This application claims the benefit of Korean Patent Application No. 10-2016-0162341, filed on Nov. 30, 2016, which is hereby incorporated in its entirety by reference as if fully set forth herein.

BACKGROUND

Field of the Disclosure

The present disclosure relates to a display device, and more particularly, to a foldable display device having a display device which can be effectively protected from external impact.

Description of the Background

A display device, which displays various pieces of information on a screen, is one of the core technologies in the information and communication age and is being developed so as to have thin thickness, light weight, high portability and high performance. Therefore, as a flat panel display device which may reduce weight and volume corresponding to drawbacks of a cathode ray tube (CRT), an organic light emitting display device which controls an amount of light emitted from an organic light emitting layer and displays an image is in the spotlight.

An organic light emitting display device includes a plurality of pixels arranged in a matrix form, thus displaying an image. Here, each pixel includes a light emitting element, and a pixel driving circuit including a plurality of transistors to independently drive the light emitting element.

Such an organic light emitting display device uses self-luminous organic light emitting elements and thus does not require a separate light source, and is capable of being implemented as an ultra-slim display device. Therefore, research on a foldable display device having an in-cell touch structure which uses organic light emitting elements and includes a touchscreen within light emitting cells is under way.

A foldable display device has a structure in which the foldable display device itself including a display panel is folded and, thus, a foldable cover window having a sufficiently small thickness is used. If external impact is applied to the cover window having such a small thickness, portion of the impact energy transmitted in the horizontal direction is low and a larger amount of the impact energy is transmitted in the vertical direction. Therefore, a larger amount of impact energy is transmitted to the display panel located inside the cover window. As a result, the display panel can be damaged, and the damaged pixels can cause defects in display, such as bright spots or blind spots.

SUMMARY

Accordingly, the present disclosure is directed to a foldable display device that substantially obviates one or more problems due to limitations and disadvantages of the related art.

The present disclosure is to provide a foldable display device which may reduce an amount of impact energy reaching a display panel, when external impact energy is transmitted, and thus protect the display panel.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a foldable display device includes a display panel including at least one folding part and non-folding parts, a cover window attached to the upper surface of the display panel and including a soft part formed in a region thereof corresponding to the folding part, and a frame configured to receive the display panel and the cover window and to pull one side and the other side of the cover window in opposite directions.

In another aspect of the present disclosure, a foldable display device includes a display panel including a folding part and a non-folding part; a cover window attached to an image displaying surface of the display panel and having a flexible part corresponding to the folding part of the display panel; and a frame accommodating the display panel and the cover window and having an external impact absorption assembly configured to tolerate an external impact applied against the display panel.

In a further aspect of the present disclosure, a foldable display device includes a display panel including a folding part and a non-folding part; a cover window attached to an image displaying surface of the display panel and having a foldable part corresponding to the folding part of the display panel; and a frame accommodating the display panel and the cover window and having an external impact absorption assembly configured to tolerate an external impact applied against the display panel, wherein the external impact absorption assembly keeps pulling the cover window to opposite directions to each other when the foldable display device is in an unfold position.

The cover window may further include a first extension extending in a first direction to a region corresponding to the outside of the display panel, a second extension extending in a second direction opposite to the first direction to another region corresponding to the outside of the display panel, and at least one hole provided at each of the first and second extensions and fastened to the frame.

The frame may further include at least one fastener fastened to the at least one hole in one-to-one correspondence. Each of the at least one fastener may include a clamp passing through each of the at least one hole and located so as to support each of the at least one hole, and an elastic part fastened between the clamp and the inner surface of the frame so as to pull the clamp in the first direction or in the second direction.

The foldable display device may further include a front case fastened to the upper surface of the frame so as to cover the display panel and the cover window, and the front case may include a bezel shielding the first and second extensions of the cover window so as not to be visible to a user.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are In the drawings.

DETAILED DESCRIPTION

Reference will now be made in detail to the aspects of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it may make the subject matter of the present disclosure rather unclear. Additionally, the terms of elements used in the following description are selected only in consideration of ease in preparation of the specification and may thus substantially differ from the terms of parts of an actual product.

In the following description of the aspects, it will be understood that, if an element or layer is referred to as being "on" or "under" another element or layer, it can be directly "on" or "under" the other element or layer, or may be indirectly formed with one or more intervening elements or layers therebetween. On the other hand, it will be understood that, when an element or layer is referred to as "contacting" another element or layer, no element or layer is present therebetween.

It will be understood that, although the terms first, second, etc. may be used herein to describe various elements, these elements should not be limited by these terms. These terms are used only to discriminate one element from other elements. Here, a first element which will be described later may be a second element within the technical scope of the present disclosure.

The sizes and thicknesses of respective elements illustrated in the drawings are only for the purpose of convenience of description, and the elements are not limited to the illustrated sizes and thicknesses.

Hereinafter, various aspects of the present disclosure will be described in detail with reference to the accompanying drawings.

Figure 1:
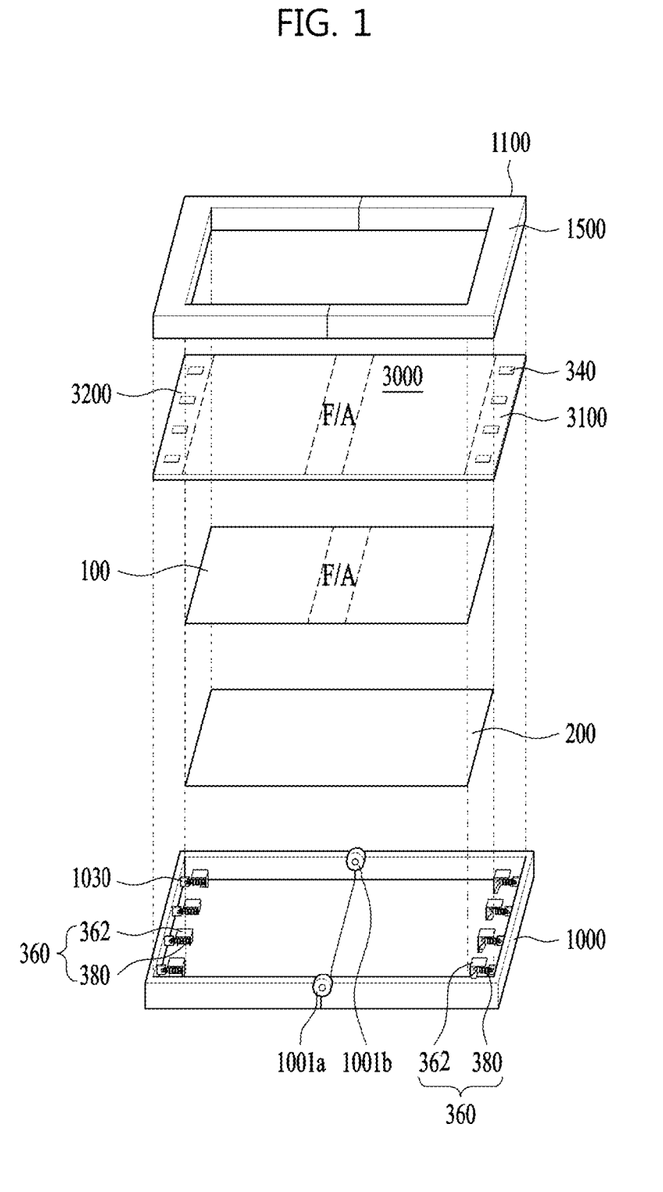
FIG. 1 is an exploded perspective view of a foldable display device in accordance with the present disclosure.

FIG. 1 is an exploded perspective view of a foldable display device in accordance with the present disclosure.

The foldable display device in accordance with the present disclosure includes a display panel 100 including a folding part F/A and displaying an image, a cover window 3000 located on the display panel 100 so as to cover the display panel 100, a back cover 200 located on the rear surface (i.e., non-image display surface) of the display panel 100 so as to support the display panel 100, a frame 1000 receiving the back cover 200, the display panel 100 and the cover window 3000, and a front case 1100 fastened to the frame 1000 covering the cover window 3000.

The cover window 3000 may be provided with a folding part F/A located in a region thereof corresponding to the folding part F/A of the display panel 100, and the folding part F/A of the cover window 3000 include a soft part which is flexible. The remaining regions of the cover window 3000 may include hard parts which have higher rigidity than the soft part, but the disclosure is not limited thereto. The cover window 3000 has a greater length than the display panel 100. That is, the cover window 3000 includes a first extension 3100 extending in a first direction, and a second extension 3200 extending in a second direction horizontally opposite to the first direction. A plurality of holes 340 is provided at the first extension 3100 and the second extension 3200.

The display panel 100 may be bonded to the cover window 3000 through an adhesive layer, but the disclosure is not limited thereto. The display panel 100 includes the folding part F/A and other regions, i.e., non-folding parts. The display panel 100 is located on the inner surface of the cover window 3000 but does not extend to the first extension 3100 and the second extension 3200. That is, the length of the display panel 100 is shorter than the length of the cover window 3000 including the first extension 3100 and the second extension 3200.

The back cover 200 is provided on the rear surface of the display panel 100. The back cover 200 may be folded at a region of the back cover 200 corresponding to the folding part F/A of the display panel 100. For this purpose, although not shown in FIG. 1, the back cover 200 may be separated at the region thereof corresponding to the folding part F/A, be formed of a flexible material which is foldable or be provided with a folding pattern formed by patterning the region of the back cover 200 corresponding to the folding part F/A, but the disclosure is not limited thereto.

The frame 1000 receives or accommodates the back cover 200, the display panel 100 and the cover window 3000. In order to fold the display panel 100, the frame 1000 includes a first hinge part 1001a and a second hinge part 1001b formed in a region thereof corresponding to the folding part F/A so as to be foldable. The hinge parts 1001a and 1001b may be formed so as to correspond to both side surfaces of the folding part F/A of the display panel 100 and allow the frame 1000 to be foldable, but the disclosure is not limited thereto. If the hinge parts 1001a and 1001b are located so as to correspond to both side surfaces of the folding part F/A of the display panel 100, the frame 100 may be separated into two pieces with respect to the hinge parts 1001a and 1001b and the two pieces may be rotated with respect to the hinge parts 1001a and 1001b. Therefore, the foldable display device in accordance with the present disclosure, both the frame 1000 and the display panel 100 are foldable.

Here, the frame 1000 pulls one side and the other side of the cover window 3000 in opposite directions. That is, one side of the cover window 3000 is fastened to one side of the frame 1000 and is thus pulled in the first direction, and the other side of the cover window 3000 is fastened to the other side of the frame 100 and is thus pulled in the second direction. For this purpose, the frame 1000 includes fasteners 360.

Each fastener 360 includes a clamp 362 and an elastic part 380. The clamps 362 of the fasteners 360 are fastened to the holes 340 provided at the first and second extensions 3100 and 3200 of the cover window 3000 in one to one correspondence. The elastic part 380 is formed between the clamp 362 and a support part 1030 provided to fasten the clamp 362 and the elastic part 380 to each other.

Therefore, the fasteners 360 are fastened to the holes 340 provided at the first and second extensions 3100 and 3200 and thus serve to pull the first extension 3100 in the first direction and to pull the second extension 3200 in the second direction due to elastic force of the elastic parts 380. That is, the cover window 3000 of the foldable display device in accordance with the present disclosure is fastened to the frame 1000 by the fasteners 360 and is thus simultaneously pulled in the first direction and in the second direction horizontally opposite to the first direction.

The front case 1100 is formed so as to surround the edge of the cover window 3000. Further, the front case 1100 may not be formed at the central part of the cover window 3000. The front case 1100 includes a bezel 1500 located on the first and second extensions 3100 and 3200 and covering the first and second extensions 3100 and 3200. The first and second extensions 3100 and 3200 are covered by the bezel 1500, thus being invisible to a user.

The front case 1100 is fastened to the frame 100, thus protecting the display panel 100 and various driving units (not shown) to drive the display panel 100 within the frame 1000.

The front case 1100 can also be folded when the display panel 100 is folded. For this purpose, the front case 1100 may further include elements for folding at a region thereof corresponding to the folding part F/A of the display panel 100. For example, the front case 1100 may be separated at the region thereof corresponding to the folding part F/A, be formed of a flexible material or be provided with separate hinge parts (not shown) so as to be foldable, but the disclosure is not limited thereto.

Figure 2A:
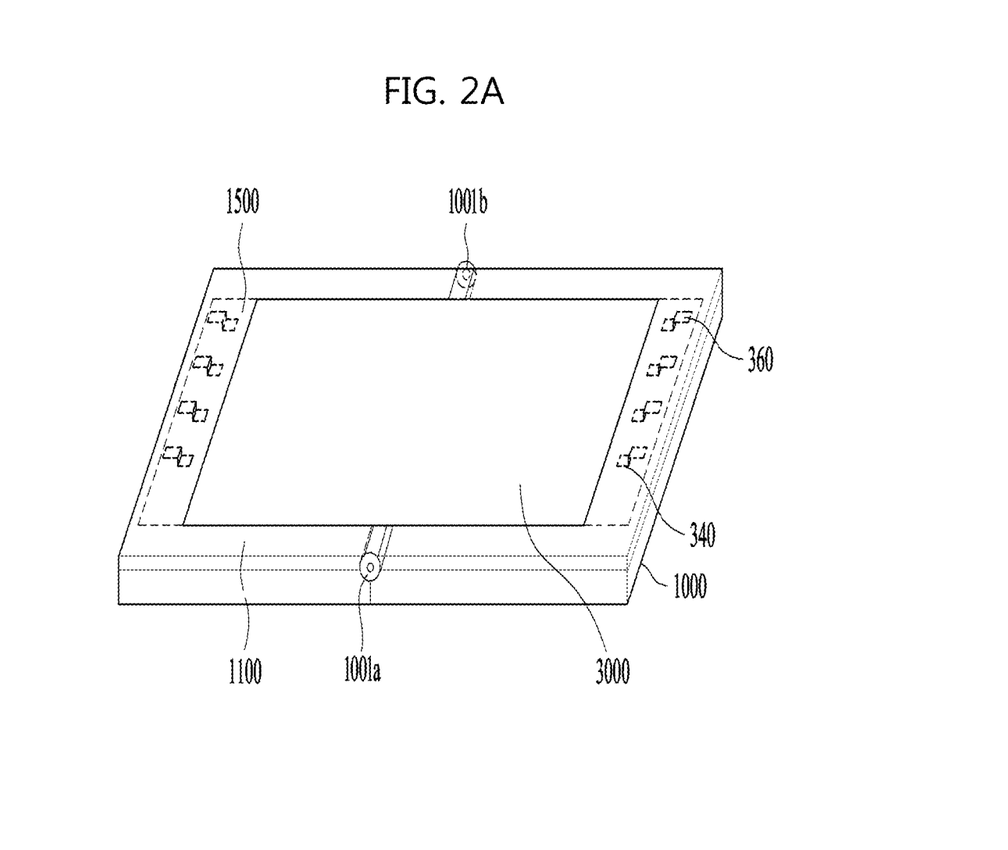
FIG. 2A is a perspective view of the foldable display device of FIG. 1 in an assembled state.
Figure 2B:
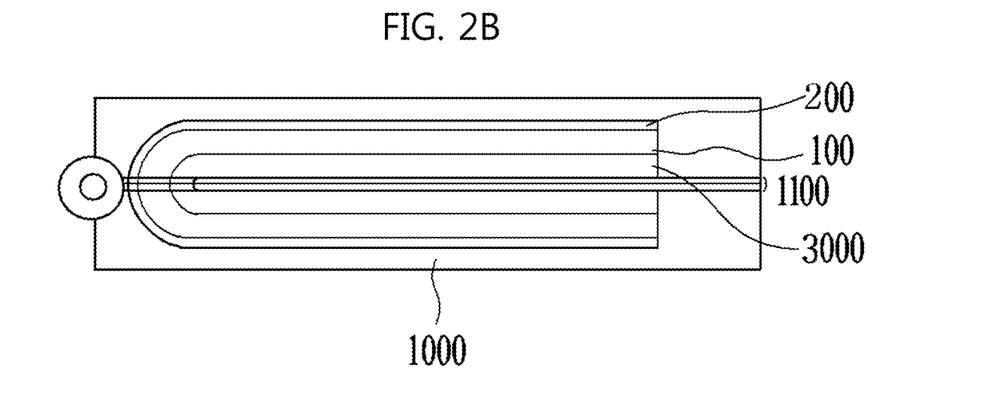
FIG. 2B is a schematic view illustrating a folded state of the foldable display device of FIG. 2A.

FIG. 2A is a perspective view of the foldable display device of FIG. 1 in an assembled state, and FIG. 2B is a schematic view illustrating a folded state of the foldable display device of FIG. 2A.

As exemplarily shown in FIG. 2A, after the foldable display device in accordance with the present disclosure is assembled, the frame 1000 and the front case 1100 are visible, and the cover window 3000 is visible through the central part of the foldable display device not provided with the front case 1100. The first and second extensions 3100 and 3200 of the cover window 3000 are shielded by the bezel 1500 of the front case 1100 and, thus, the holes 340 provided at the first and second extensions 3100 and 3200 and the support parts 1030 are not visible.

Although not shown in FIG. 2A, the display panel 100 is located under the cover window 3000 and thus displays an image through the cover window 3000. The hinge parts 1001a and 1001b provided on the frame 1000 may be located within the front case 1100 and thus be invisible, or may protrude from the front case 1100, but the disclosure is not limited thereto. Further, since the front case 1100 should be folded, the front case 1100 may be separated into two pieces about the hinge parts 1001a and 1001b, a region of the front case 1100 corresponding to the folding part F/A may be formed of a flexible material, or the front case 1100 may be provided with separate hinge parts (not shown), but the disclosure is not limited thereto.

The frame 1000 may be separated into two pieces based on the hinge parts 1001a and 1001b.

When the foldable display device in accordance with the present disclosure including the above-described frame 1000 and front case 1100 is folded, as exemplarily shown in FIG. 2B, the frame 1000 and the front case 1100 may be folded simultaneously with the display panel 100, the cover window 3000 and the back cover 200.

Figure 3:
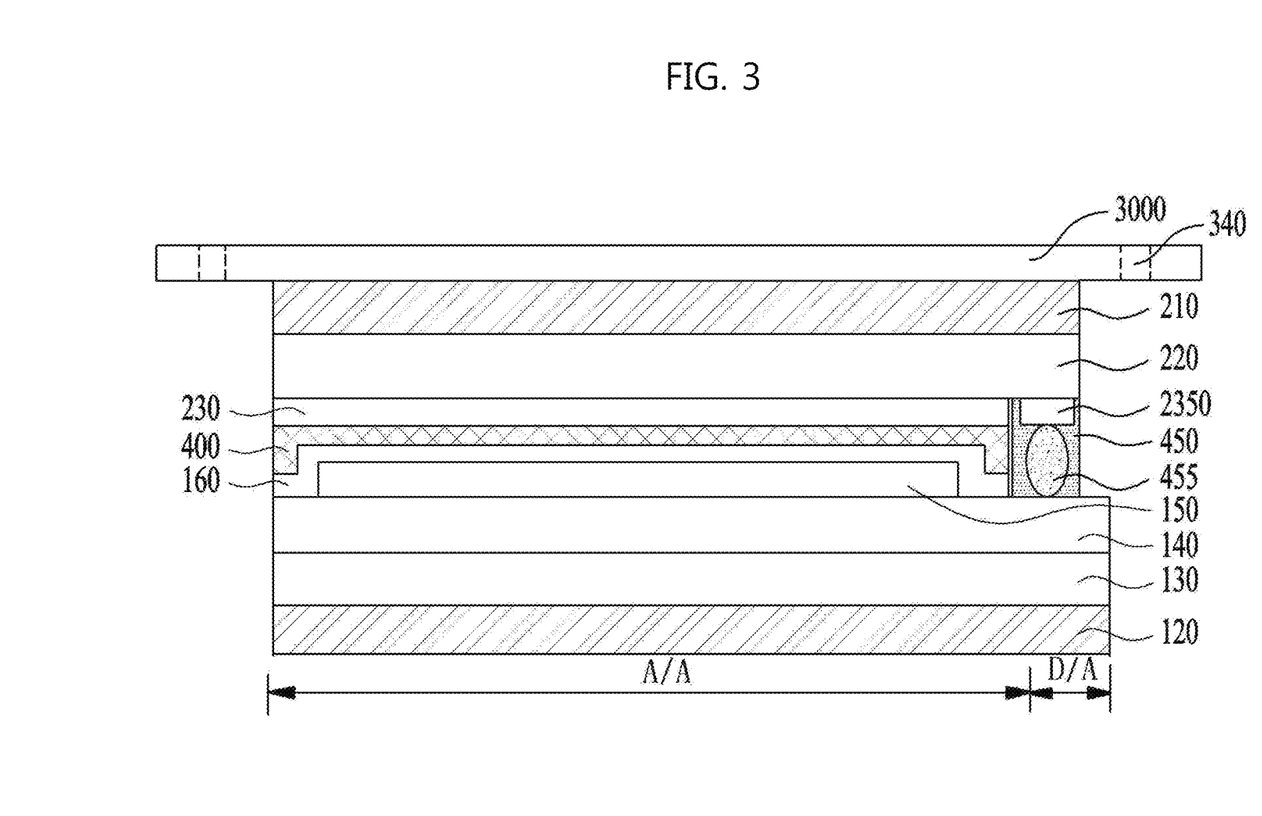
FIG. 3 is a cross-sectional view illustrating the structure of a display panel in accordance with one aspect of the present disclosure.

FIG. 3 is a cross-sectional view illustrating the structure of the display panel 100 in accordance with one aspect of the present disclosure.

With reference to FIG. 3, the display panel 100 will be described in more detail. The display panel 100 may include a first base material 120, a first buffer layer 130 located on the first base material 120, a thin film transistor array 140 including thin film transistors respectively disposed in pixels defined in a matrix on the first buffer layer 130, an organic light emitting array 150 connected to the thin film transistors of the respective pixels, a protective layer 160 covering the thin film transistor array 140 except for pad parts and the organic light emitting array 150, a touch electrode array 230 attached to the protective layer 160 by an adhesive layer 400 interposed therebetween, a second buffer layer 220 and a second base material 210 sequentially formed on the touch electrode array 230, and the cover window 3000 located on the second base material 210.

The display panel 100 in accordance with the present disclosure is not limited to the above aspect, and a foldable display device including the thin film transistor array 140 and the organic light emitting array 150 may be widely applied.

An active area A/A and a dead area D/A are defined on each of the first buffer layer 130 and the second buffer layer 220, and the touch electrode array 230, the organic light emitting array 150 and the thin film transistors in the thin film transistor array 140 except for the pad parts are formed in the active area A/A. Touch pad parts 2350 and the pad parts of the thin film transistor array 140 are defined in some regions of the dead area D/A.

Here, the first and second base materials 120 and 210 serve to prevent damage to internal arrays during laser irradiation or an etching process and, as circumstances require, the first and second base materials 120 and 210 serve to protect the display device from the outside. The first and second base materials 120 and 210 may be formed of a polymer, such as polyimide and photoacryl.

Each of the first buffer layer 130 and the second buffer layer 220 is formed by continuously stacking the same inorganic film, such as an oxide ($SiO_2$) film or a nitride ($SiN_x$) film or alternately stacking different inorganic films. The first and second buffer layers 130 and 220 serve as barriers to prevent moisture or outdoor air from permeating the organic light emitting array 150 after a process of bonding an upper surface to a lower substrate.

The touch electrode array 230 and the touch pad parts 2350 are formed on the same surface of the second buffer layer 220. The touch pad parts 2350 are connected to the pad parts (not shown) of the thin film transistor array 140 by a sealer 450 including conductive balls 455 during the process of bonding the upper and lower substrates by the adhesive layer 400. Here, the adhesive layer 400 has a moisturepermeation preventing function, and directly contacts the protective layer 160 covering the organic light emitting array 150 and thus serves to prevent outdoor air from permeating the organic light emitting array 150 and to more completely prevent moisture from permeating the organic light emitting array 150, in addition to the function of the protective layer 160.

Here, one side of the thin film transistor array 140 including the pad parts protrudes from the touch electrode array 230, and a driving circuit which transmits a signal to drive the touch electrode array 230, the thin film transistor array 140 and the organic light emitting array 150 may be provided at the protruding part of the thin film transistor array 140, but the disclosure is not limited thereto. Although not shown in the drawings, the driving circuit, thin film transistor array driving pads and dummy pads include a plurality of dummy electrodes, and the dummy electrodes are connected to the driving circuit by wirings. Further, the driving circuit is connected to a flexible printed circuit board (FPCB, not shown) by bonding and may thus be controlled by a timing controller (not shown) and a microcontroller unit (MCU, not shown) provided on the FPCB. The dummy pads are formed in the same layer as metal forming gate lines or data lines in regions corresponding to the touch pad parts 2350, out of the dead area D/A at the outside of the active area A/A. Further, the driving circuit may be mounted on the FPCB or on an anisotropic conductive film (ACF) and thus provided on the rear surface of the display panel 100.

The driving circuit mounted on the FPCB or the ACF may be mounted in a chip on film (COF) manner.

Although not shown in the drawings, the thin film transistor array driving pads and the dummy pads are connected to the FPCB by wirings (not shown). Further, a controller (not shown) to control the driving circuit may be further provided on the FPCB.

The dummy pads are formed in the same layer as metal forming the gate lines or the data lines in regions corresponding to the touch pad parts 2350, out of the dead area D/A at the outside of the active area A/A.

Figure 4:
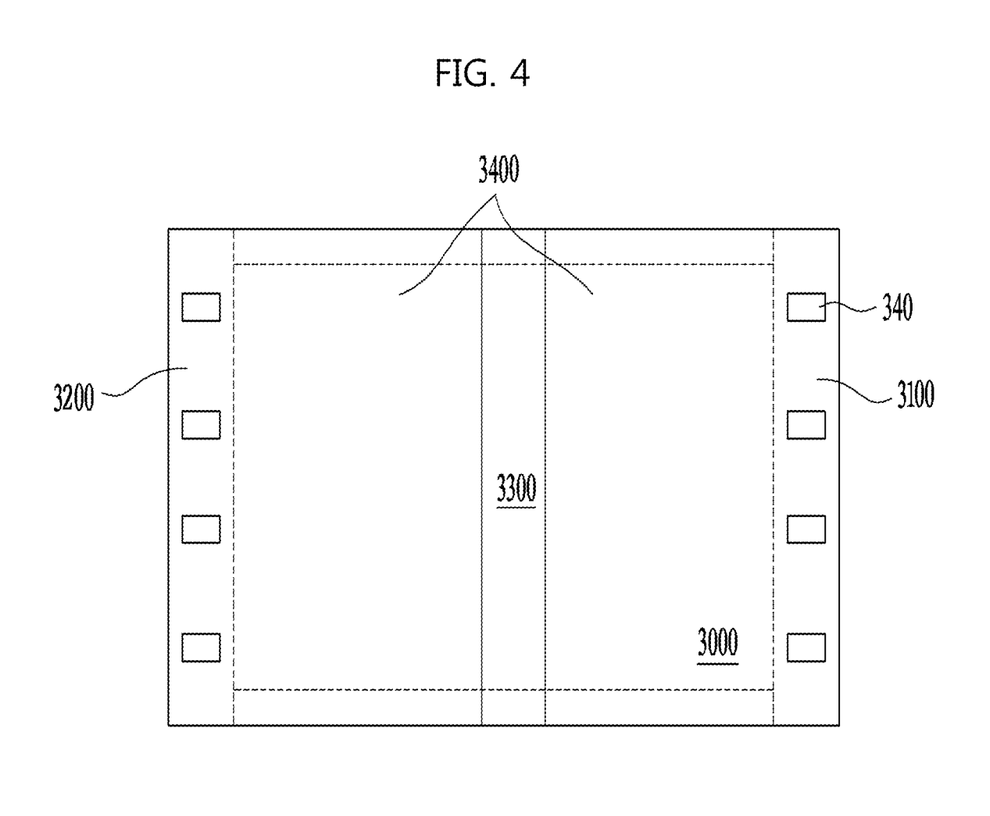
FIG. 4 is a plan view illustrating a cover window in accordance with an aspect of the present disclosure.

FIG. 4 is a plan view illustrating the cover window 3000 in accordance with an aspect of the present disclosure. With reference to FIG. 4, the cover window 3000 includes a soft part 3300 having flexibility in a region of the cover window 3000 corresponding to the folding part F/A of the display panel 100. Further, the cover window 3000 includes the first extension 3100 and the second extension 3200 extending in the first direction and in the second direction horizontally opposite to the first direction so that the length of the cover window 3000 is greater than the length of the display panel 100. The first and second extensions 3100 and 3200 may be formed of the same material as the material for the cover window 3000 integrally with the cover window 300. Further, the holes 340 may be formed at the first and second extensions 3100 and 3200.

The cover window 3000 includes hard parts 3400, which are formed of a material having higher rigidity than the soft part 3300, in regions of the cover window 3000 corresponding to the non-folding parts of the display panel 100. Here, the soft part 3200 and the hard parts 3400 may be formed of various materials, such as silicone resin, plastic, etc. Further, the soft part 3200 and the hard parts 3400 may be formed of different kinds of materials having different rigidities, or be integrally formed of the same kind of materials having different hardness.

Figure 5:
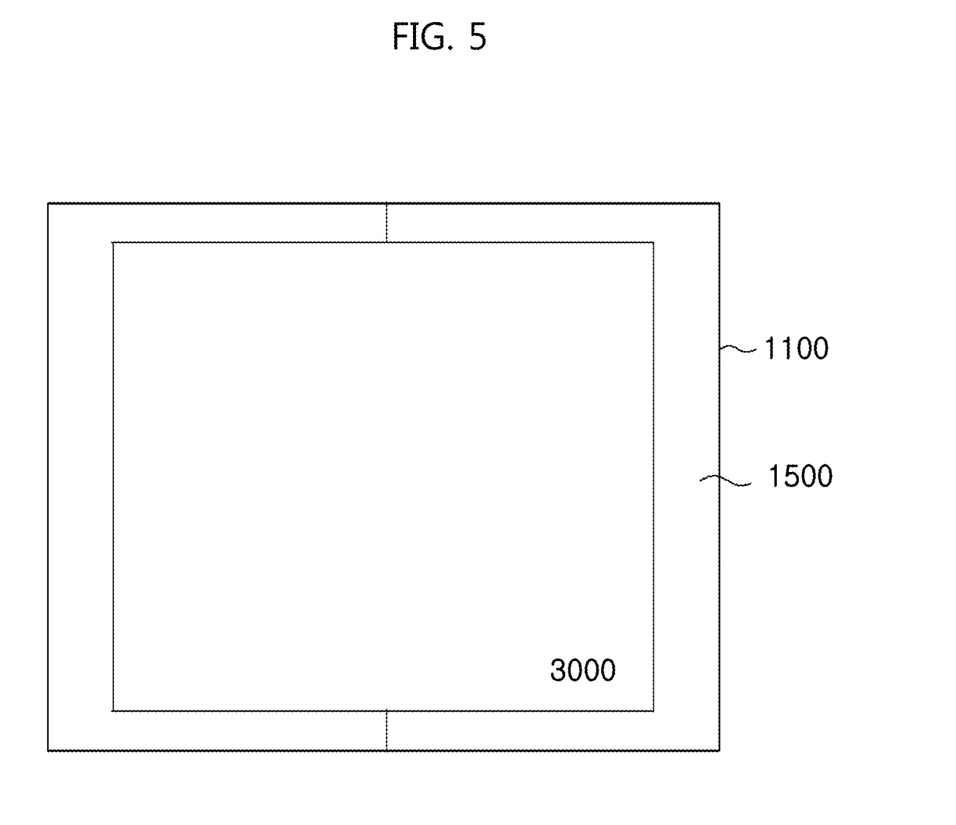
FIG. 5 is a plan view illustrating a front case located on the cover window.

FIG. 5 is a plan view illustrating the front case 1100 located on the cover window 3000. As described above, the front case 1100 is formed so as to cover the edge of the cover window 3000, as exemplarily shown in FIG. 5. Particularly, the front case 1100 covers the first and second extensions 3100 and 3200 of the cover window 3000. For this purpose, the front case 1100 includes the bezel 1500 formed so as to cover the holes 340 of the cover window 3000. Therefore, the first and second extensions 3100 and 3200 of the cover window 3000 are shielded by the bezel 1500, thus being invisible to a user.

Figure 6:
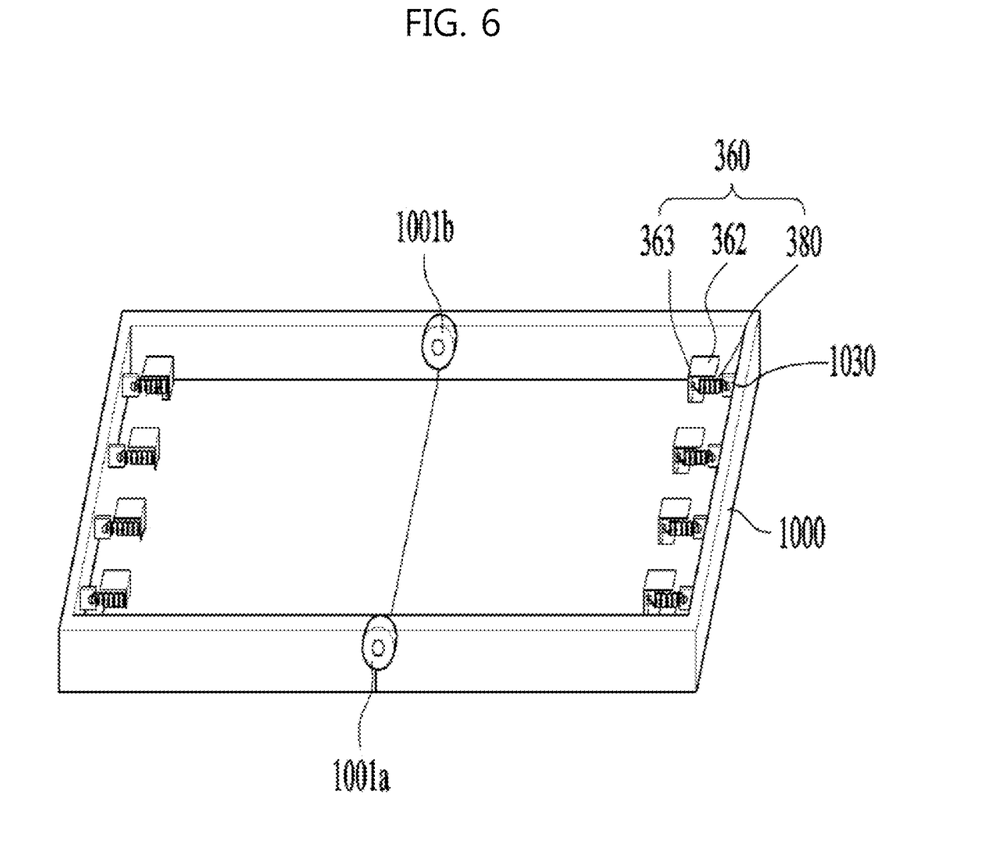
FIG. 6 is a perspective view illustrating a frame in more detail.

FIG. 6 is a perspective view illustrating the frame 1000 in more detail.

The frame 1000 receives or accommodates the back cover 200, the display panel 100 and the cover window 3000. Here, the back cover 200 is bonded to the cover window 3000 by an adhesive layer (not shown) and thus the back cover 200 and the display panel 100 may be fixed.

With reference to FIGS. 1 and 6, the frame 1000 includes the hinge parts 1001a and 1001b in regions of the frame 1000 corresponding to both side surfaces of the folding part F/A of the display panel 100. The hinge parts 1001a and 1001b have a circular structure and are located on the side walls of the frame 1000. The frame 100 may be divided into two pieces based on the hinge parts 1001a and 1001b formed on both side walls thereof. Here, the two divided pieces of the frame 1000 are connected by the hinge parts 1001a and 1001b and may thus be folded such that the bottom surfaces thereof are separated from each other, as shown in FIG. 2B.

Further, as described above, the frame 1000 is provided with the fasteners 360. As described above, the fasteners 360 are fastened to the holes 340 provided at the first and second extensions 3100 and 3200 of the cover window 3000. For this purpose, each fastener 360 includes the clamp 362 and the elastic part 380. The elastic part 380 includes a spring and is fastened between the inner wall of the frame 1000 and the clamp 362. For this purpose, the clamps 362 may be provided with first support parts 363, and the second support parts 1030 may be provided on the inner wall of the frame 1000. The second support parts 1030 may protrude from the inner wall of the frame 1000 in the direction towards the clamps 362, and a hole may be formed through the center of the protruding portion of the second support part 1030. One side of the elastic part 380 is fastened to the hole.

The first support part 363 protrudes from the clamp 362 in the direction towards the second support part 1030. Further, a hole is formed through the center of the protruding portion of the first support part 363, and the other side of the elastic part 380, one side of which is fastened to the second support part 1030, is fastened to the hole.

Here, the fasteners 360 are provided in a region of the frame 1000 corresponding to the first extension 3100 and a region of the frame 1000 corresponding to the second extension 3200. The fasteners 360 are fastened to the holes 340 of the first and second extensions 3100 and 3200 and thus pull the two pieces of the cover window 3000 in the first and second directions which are horizontally opposite to each other, as described above.

Figure 7:
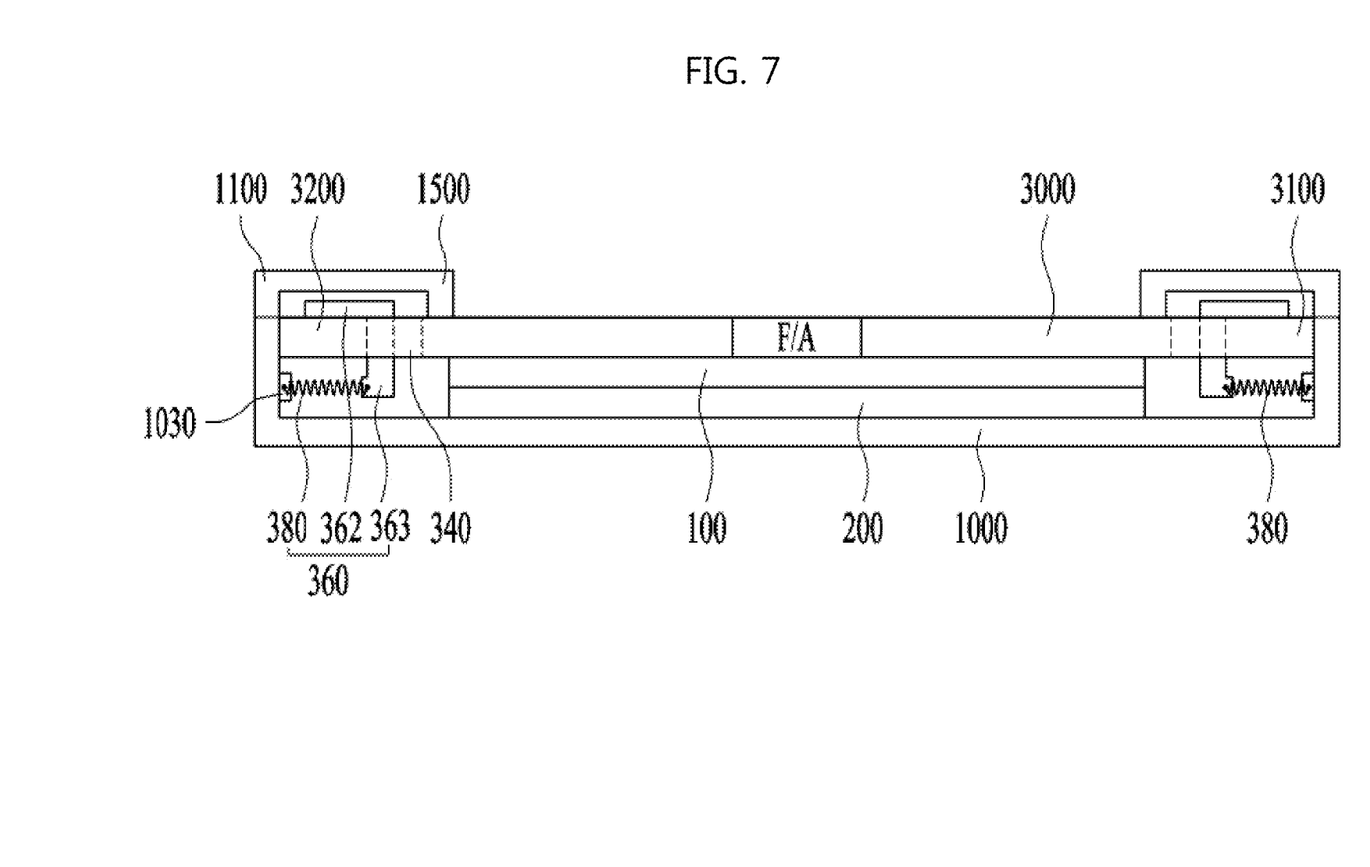
FIG. 7 is a cross-sectional view of the foldable display device in accordance with the present disclosure.

FIG. 7 is a cross-sectional view of the foldable display device in accordance with the present disclosure.

With reference to FIG. 7, the back cover 200 may be located on the rear surface of the display panel 100. Further, although not shown in FIG. 7, a battery or driving circuits may be further disposed within the frame 100 at the rear of the back cover 200.

With reference to FIG. 7, the frame 1000 and the front case 1100 may be combined by screws (not shown) or an adhesive. Further, the end of the front case 1100 located on the cover window 3000 may be a downward curved structure to be curved towards the cover window 3000.

As described above, the fastener 360 includes the clamp 362 provided so as to pass through the hole 340, and the elastic part 380 fastened between the clamp 362 and the inner surface of the frame 1000. The elastic part 380 may include a spring structure. The elastic part 380 is fastened between the first support part 363 of the clamp 362 and the second support part 1030 provided on the inner surface of the frame 1000. FIG. 7 illustrates the structures of the first support part 363 and the second support part 1030 in more detail. The first support part 363 protrudes from one side of the clamp 362 towards the inner wall of the frame 1000. Here, the first support part 363 may be formed integrally with the clamp 362. The hole to fix one side of the elastic part 380 is provided at the center of the first support part 363.

The second support part 1030 protrudes from the inner wall of the frame 1000 towards the first support part 363, i.e., the display area. Further, the second support part 1030 is fastened and fixed to one side of the elastic part 380, the other side of which is fastened to the first support part 363.

The elastic parts 380 have an elastic force to maximally pull the clamps 362, i.e., to the point at which the elastic parts 380 maximally contract, and thus maximally pull the first and second extensions 3100 and 3200 of the cover window 3000 when the fasteners 360 are combined with the first and second extensions 3100 and 3200. Therefore, a pulling force is applied to the first extension 3100 of the cover window 3000, to which clamps 363 are fastened through the holes 340, in the first direction and the pulling force is applied to the second extension 3200 of the cover window 3000 in the second direction horizontally opposite to the first direction. Consequently, the cover window 3000 is consistently pulled in the first and second directions, simultaneously.

For the purpose of folding, the first and second extensions 3100 and 3200 of the cover window 3000 include the hard parts having higher rigidity than the soft part provided in the region of the cover window 3000 corresponding to the folding part F/A of the display panel 100. The hard parts may include a material having high rigidity so as to withstand stress applied to the holes 340 of the cover window 3000 due to the clamps 323. The hard parts may be formed of a different material from the soft part, or be formed integrally with the soft part.

The bezel 1500 is provided so as to completely shield the first and second extensions 3100 and 3200 of the cover window 3000, thus preventing the holes 340 of the first and second extensions 3100 and 3200 and the fasteners 360 from being visible to a user.

Figure 8:
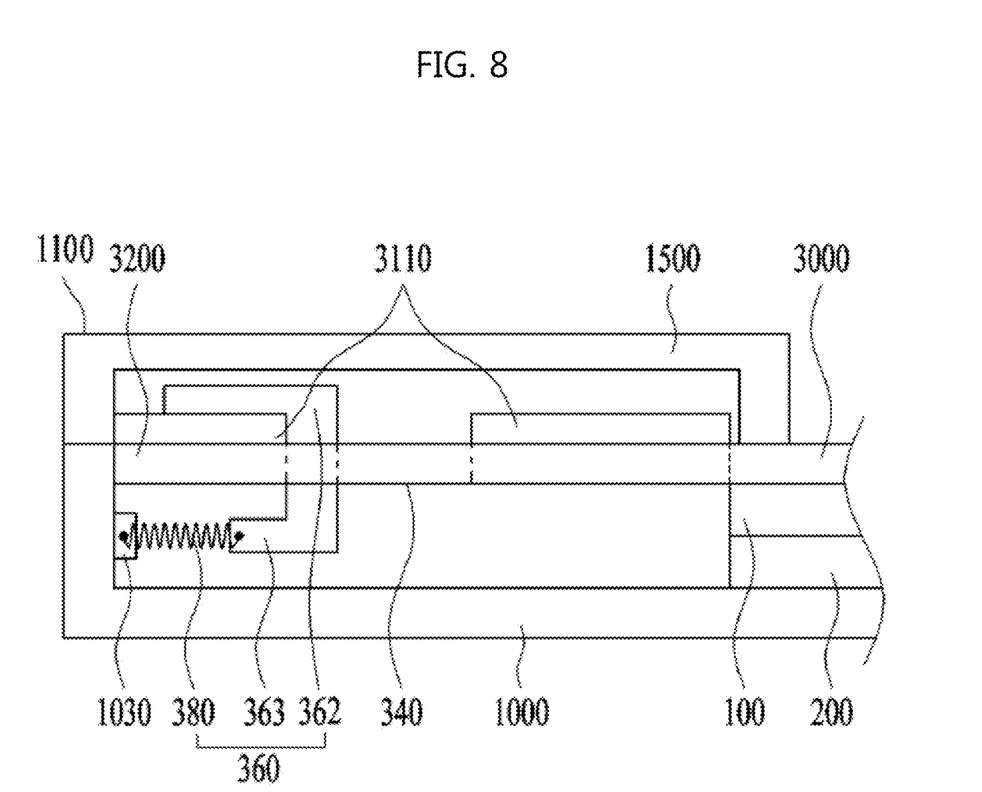
FIG. 8 is a cross-sectional view of the foldable display device provided with a protective unit protecting the cover window in accordance with the present disclosure.

FIG. 8 is a cross-sectional view of the foldable display device provided with a protective unit protecting the cover window 3000 in accordance with the present disclosure.

With reference to FIG. 8, the second extension 3200 may be formed to have a greater thickness than other regions of the cover window 3000. Although FIG. 8 illustrates the second extension 3200 only, the first extension 3100 and the second extension 3200 are formed to have a greater thickness than other regions of the cover window 3000, i.e., a region of the cover window 3000 corresponding to the display panel 1000. Particularly, a protective film 3110 having higher rigidity than the soft part may be attached to the first extension 3100 and the second extension 3200. Here, the protective film 3110 is not provided at the holes 340.

Although FIG. 8 illustrates the protective film 3110 as being located on the second extension 3200, the disclosure is not limited thereto and the protective film 3110 may be attached to the rear surface of the second extension 3200.

When the protective film 3110 is attached to the first and second extensions 3100 and 3200, rigidity of the first and second extensions 3100 and 3200 can be improved without any additional process and, thus, deformation of the cover window 3000 due to stress applied to the holes 340 of the cover window 3000 is prevented.

Figure 9A:
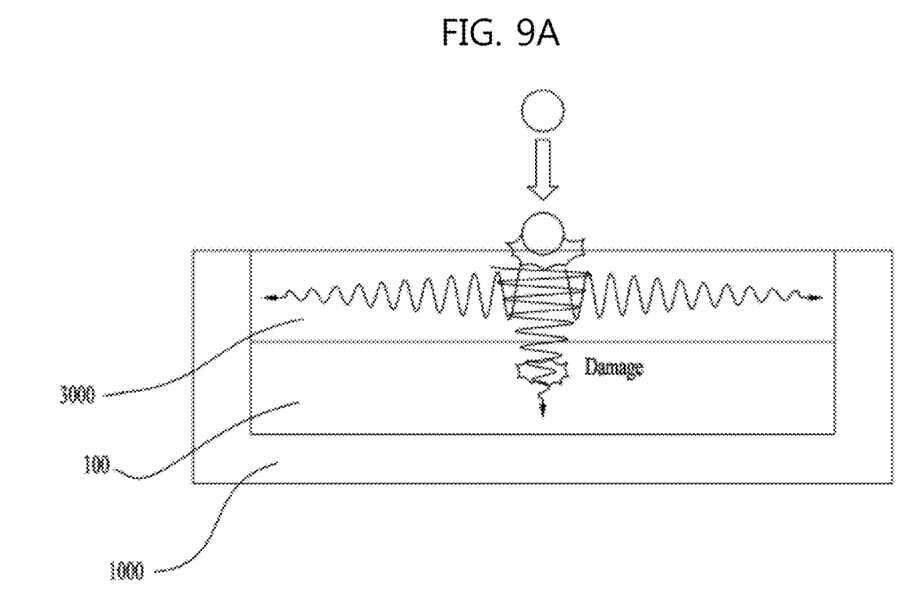
FIGS. 9A and 9B are exemplary views respectively illustrating impact absorption characteristics of the related art foldable display device and the foldable display device in accordance with the present disclosure.
Figure 9B:
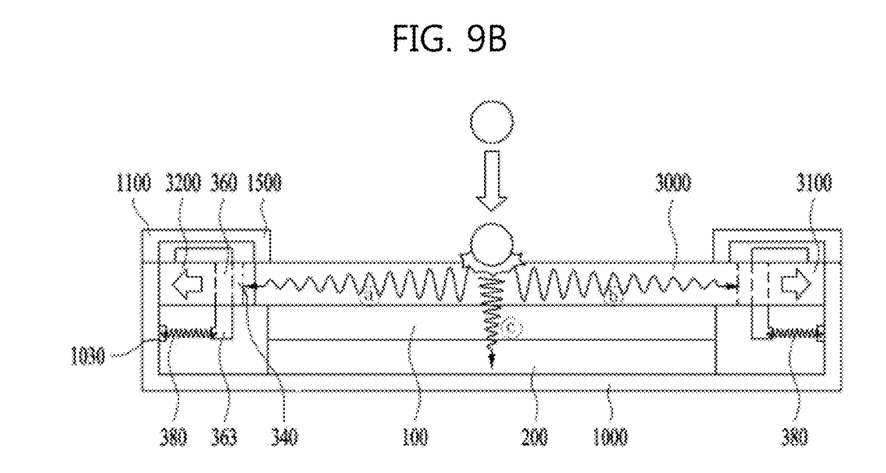

FIGS. 9A and 9B are exemplary views illustrating impact absorption characteristics of the related art foldable display device and the foldable display device in accordance with the present disclosure.

If external impact is applied to the foldable display device, stress due to such impact starts from the cover window 3000 and is transmitted in the vertical direction, i.e., in a direction passing through the cover window 3000, and in the horizontal direction, i.e., in a direction across the cover window 3000. Here, the stress transmitted in the vertical direction is transmitted to the display panel 100, but the stress transmitted in the horizontal direction does not affect the display panel 100. In other words, the organic light emitting array 150 of the display panel 100 may be damaged due to the stress transmitted in the vertical direction but the stress transmitted in the horizontal direction scarcely affects the display panel 100.

Particularly, as shown in FIG. 9A, in the related art foldable display device, a cover window 3000 has a small thickness so as to be folded and a region of the cover window 3000 corresponding to a folding part F/A is flexible.

Therefore, in the related foldable display device, there is a high possibility that the cover window 3000 will be deformed due to the stress applied when the impact is applied to the cover window 3000, and due to such deformation of the cover window 3000, an organic light emitting array can be damaged. Further, since the cover window 3000 has a small thickness, an amount of impact energy which the cover window 3000 may withstand is relatively small and, thus, a lot of stress is transmitted to a display panel 100. Accordingly, the related art foldable display device has drawbacks, such as low impact resistance and damage to the organic light emitting array due to impact. In addition, in the related art foldable display device, the cover window 3000 is deformed and, thus, a display picture can be distorted.

On the other hand, as shown in FIG. 9B, in the foldable display device in accordance with the present disclosure, the fasteners 360 pull the cover window 3000 in horizontally opposite directions, and the respective fasteners 360 have an elastic force through the elastic parts 380. Therefore, when the cover window 3000 and the display panel 100 attached to the cover window 3000 are spread, i.e., in an unfolded state, pulling force is applied thereto in both directions and, thus, flatness of the display panel 100 and the cover window 3000 is increased. When flatness of the display panel 100 and the cover window 3000 is increased, distortion of a display picture is prevented and, even if impact is applied to the upper surface of the cover window 3000, deformation of the cover window 3000 can be minimized, stress applied to the display panel 100 due to deformation of the cover window 3000 is minimized, and damage to the organic light emitting array 150 is prevented.

Further, in the foldable display device in accordance with the present disclosure, as the cover window 3000 is fixed so as to be pulled in horizontally opposite directions, the portion of impact energy transmitted in the horizontal direction is greatly increased. That is, when impact occurs, energy and stress transmitted in the vertical direction are minimized and impact resistance of the display panel 100 is improved. Since the respective fasteners 360 include the elastic parts 380, a frictional force generated when the fasteners 360 are fastened to the cover window 3000 is also minimized.

Figure 10:
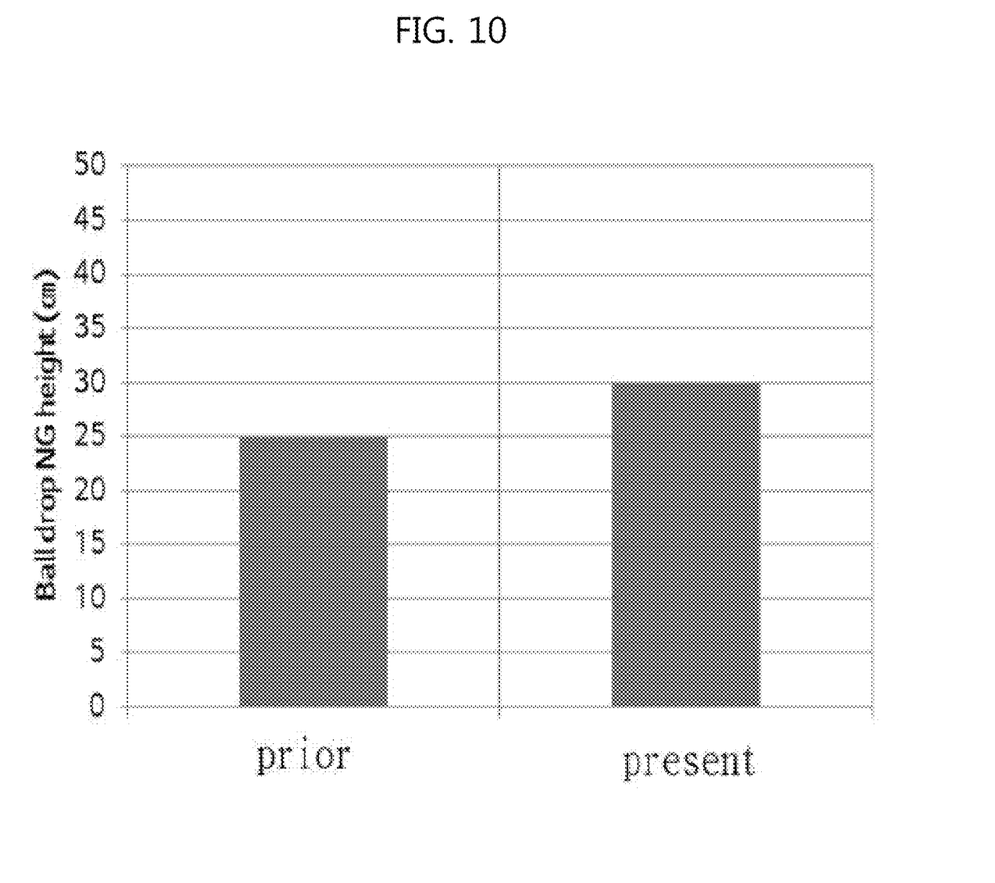
FIG. 10 is a graph illustrating an improvement in impact resistance of the foldable display device in accordance with the present disclosure.

FIG. 10 is a graph illustrating impact resistance improvement of the foldable display device in accordance with the present disclosure. Here, the y-axis represents a height (cm) of an iron ball at which a display panel is initially damaged, when the iron ball having a designated weight is dropped onto a foldable display device.

In the related art foldable display device, the display panel 100 is initially damaged when the iron ball having such a weight is dropped onto the related art foldable display device from a height of 25 cm. On the other hand, in the foldable display device in accordance with the present disclosure, the display panel 100 is not damaged until the iron ball is dropped onto the foldable display device from a height of about 30 cm. That is, it may be confirmed that the foldable display device in accordance with the present disclosure has impact resistance increased by about 20%, as compared to the related art foldable display device.

As is apparent from the above description, in a foldable display device in accordance with the present disclosure, fasteners pull a cover window in horizontally opposite directions, and the respective fasteners include elastic parts and thus have an elastic force. Therefore, when the cover window and a display panel attached to the cover window are spread, i.e., in an unfolded state, pulling force is applied thereto in both directions and, thus, flatness of the display panel and the cover window is increased. When flatness of the display panel and the cover window is increased, distortion of a display picture disappears and, even if impact is applied to the upper surface of the cover window, deformation of the cover window is minimized, stress applied to the display panel due to deformation of the cover window is minimized, and damage to an organic light emitting array is prevented.

In addition, in the foldable display device in accordance with the present disclosure, as the cover window is fixed so as to be pulled in horizontally opposite directions, the portion of impact energy transmitted in the horizontal direction is greatly increased. That is, when impact occurs, energy and stress transmitted in the vertical direction are minimized and impact resistance of the display panel is improved. Since the respective fasteners include the elastic parts, frictional force generated when the fasteners are fastened to the cover window is also minimized.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A foldable display device comprising:
    a display panel including at least one folding part and non-folding parts;
    a cover window attached to an image displaying surface of the display panel and including a foldable part corresponding to the folding part; and
    a frame accommodating the display panel and the cover window and pulling the cover window to opposite directions to each other.

2. The foldable display according to claim 1, wherein the cover window further includes a first extension extending to a first direction to a region corresponding to a first outside portion of the display panel, a second extension extending in a second direction opposite to the first direction to another region corresponding to a second outside portion of the display panel, and at least one hole provided at each of the first and second extensions, the at least one hole being fastened to the frame.

3. The foldable display device according to claim 2 wherein the frame includes at least one fastener fastened to the at least one hole.

4. The foldable display device according to claim 3, wherein each of the at least one fastener includes:
    a clamp passing through each of the at least one hole and supporting each of the at least one hole; and
    an elastic part fastened between the clamp and the inner surface of the frame and pulling the clamp in the first direction or in the second direction.

5. The foldable display device according to claim 4, wherein the elastic part includes a spring.

6. The foldable display device according to claim 5, wherein the clamp has a first support part attached to a first end of the spring.

7. The foldable display device according to claim 6, wherein the frame has a second support part a second end of the spring.

8. The foldable display device according to claim 2, further comprising a front case fastened to the frame covering the display panel and the cover window and including a bezel shielding the first and second extensions of the cover window.

9. The foldable display device according to claim 2, wherein the first and second extensions have hard parts having higher rigidity than the foldable part.

10. The foldable display device according to claim 9, wherein each of the first and second extensions has a thickness greater than the thickness of a region of the cover window located to overlap the display panel.

11. The foldable display device according to claim 2, further comprising a protective film on at least one of upper and lower surfaces of the first and second extensions and exposing the at least one hole.

12. The foldable display device according to claim 11, wherein the protective film is formed of a material having rigidity greater than the soft part of the cover window.

13. A foldable display device comprising:
    a display panel including a folding part and a non-folding part;
    a cover window attached to an image displaying surface of the display panel and having a flexible part corresponding to the folding part of the display panel; and
    a frame accommodating the display panel and the cover window and having an external impact absorption assembly configured to tolerate an external impact applied against the display panel.

14. The foldable display device according to claim 13, wherein the external impact absorption assembly comprises:
    a clamp holding the cover window and the frame; and
    an elastic part fastened between the clamp and an inner surface of the frame and pulling the clamp toward outward directions from the frame.

15. The foldable display device according to claim 14, wherein the elastic part includes a spring.

16. The foldable display device according to claim 15, wherein the clamp has a first support part attached to a first end of the spring.

17. The foldable display device according to claim 16, wherein the frame has a second support part attached to a second end of the spring.

18. A foldable display device comprising:
a display panel including a folding part and a non-folding part;
a cover window attached to an image displaying surface of the display panel and having a foldable part corresponding to the folding part of the display panel; and
a frame accommodating the display panel and the cover window and having an external impact absorption assembly configured to tolerate an external impact applied against the display panel, wherein the external impact absorption assembly keeps pulling the cover window to opposite directions to each other when the foldable display device is in an unfold position.

19. The foldable display device according to claim 18, wherein the external impact absorption assembly comprises:
a clamp holding the cover window and the frame; and
an elastic part fastened between the clamp and an inner surface of the frame and pulling the clamp toward outward directions from the frame.

20. The foldable display device according to claim 19, wherein the elastic part includes a spring.

21. The foldable display device according to claim 20, wherein the clamp has a first support part attached to a first end of the spring.

22. The foldable display device according to claim 21, wherein the frame has a second support part attached to a second end of the spring.

23. The foldable display according to claim 1, wherein the cover window has first and second extensions at both side ends and has a length greater than the display panel by the first and second extensions, wherein the first and second extensions extend to opposite directions to each other, each extension has at least one hole, and fastened to the frame through the at least one hole.

* * * * *